United States Patent
Liu et al.

(10) Patent No.: US 11,271,078 B2
(45) Date of Patent: Mar. 8, 2022

(54) P-TYPE FIELD EFFECT TRANSISTOR HAVING CHANNEL REGION WITH TOP PORTION AND BOTTOM PORTION

(71) Applicant: UNITED MICROELECTRONICS CORP., Hsin-Chu (TW)

(72) Inventors: Shi-You Liu, Kaohsiung (TW); Tsai-Yu Wen, Tainan (TW); Ching-I Li, Tainan (TW); Ya-Yin Hsiao, Taipei (TW); Chih-Chiang Wu, Tainan (TW); Yu-Chun Liu, Miaoli County (TW); Ti-Bin Chen, Tainan (TW); Shao-Ping Chen, Kaohsiung (TW); Huan-Chi Ma, Tainan (TW); Chien-Wen Yu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 7 days.

(21) Appl. No.: 16/836,953

(22) Filed: Apr. 1, 2020

(65) Prior Publication Data
US 2020/0235208 A1 Jul. 23, 2020

Related U.S. Application Data

(62) Division of application No. 15/893,681, filed on Feb. 11, 2018, now Pat. No. 10,651,275.

(30) Foreign Application Priority Data

Jan. 11, 2018 (TW) .................. 107101053

(51) Int. Cl.
*H01L 29/10* (2006.01)
*H01L 29/78* (2006.01)
*H01L 29/66* (2006.01)
*H01L 21/324* (2006.01)
(Continued)

(52) U.S. Cl.
CPC ...... *H01L 29/105* (2013.01); *H01L 21/26506* (2013.01); *H01L 21/26513* (2013.01); *H01L 21/26533* (2013.01); *H01L 21/324* (2013.01); *H01L 21/823412* (2013.01); *H01L 29/1054* (2013.01); *H01L 29/6659* (2013.01);
(Continued)

(58) Field of Classification Search
CPC ............... H01L 29/105; H01L 29/6659; H01L 29/1054; H01L 29/66545; H01L 29/7833; H01L 29/66492; H01L 21/26506; H01L 21/26533; H01L 21/8234; H01L 21/324; H01L 21/26513; H01L 21/2652
See application file for complete search history.

(56) References Cited

U.S. PATENT DOCUMENTS

| 6,897,118 B1 | 5/2005 | Poon et al. |
| 7,176,530 B1 | 2/2007 | Bulucea |
| 8,846,510 B2 | 9/2014 | Chuang et al. |

(Continued)

*Primary Examiner* — Nilufa Rahim
(74) *Attorney, Agent, or Firm* — Winston Hsu

(57) ABSTRACT

A p-type field effect transistor (pFET) includes a gate structure on a substrate, a channel region in the substrate directly under the gate structure, and a source/drain region adjacent to two sides of the gate structure. Preferably, the channel region includes a top portion and a bottom portion, in which a concentration of germanium in the bottom portion is lower than a concentration of germanium in the top portion and a depth of the top portion is equal to a depth of the bottom portion.

1 Claim, 3 Drawing Sheets

(51) Int. Cl.
*H01L 21/265* (2006.01)
*H01L 21/8234* (2006.01)

(52) U.S. Cl.
CPC .. *H01L 29/66492* (2013.01); *H01L 29/66545* (2013.01); *H01L 29/7833* (2013.01)

(56) References Cited

U.S. PATENT DOCUMENTS

| | | |
|---|---|---|
| 2004/0072394 A1 | 4/2004 | Noda |
| 2008/0128750 A1* | 6/2008 | Enicks ............ H01L 21/823807 257/191 |
| 2012/0083087 A1 | 4/2012 | Ema |
| 2014/0103429 A1 | 4/2014 | Chuang |
| 2014/0367787 A1* | 12/2014 | Vakada ................ H01L 27/092 257/369 |
| 2019/0165175 A1* | 5/2019 | More ............... H01L 29/66545 |

* cited by examiner

P-TYPE FIELD EFFECT TRANSISTOR HAVING CHANNEL REGION WITH TOP PORTION AND BOTTOM PORTION

CROSS REFERENCE TO RELATED APPLICATIONS

This application is a division of U.S. application Ser. No. 15/893,681 filed Feb. 11, 2018, and incorporated herein by reference in its entirety.

BACKGROUND OF THE INVENTION

1. Field of the Invention

The invention relates to a method for fabricating metal-oxide-semiconductor (MOS) transistor, and more particularly to a method of using ion implantation process to form channel layer in a substrate.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Nevertheless, as semiconductor technology advances, gate structures employing work function materials soon reaches their physical and electrical limitation, causing side-effects including electrical instability and negative bias temperature instability (NBTI) effect.

NBTI effect is typically caused by accumulation of electrical potentials between silicon substrate and silicon oxide layers, which induces an effect when gate electrode is negatively biased. As PMOS transistors apply negative bias to generate electrons on metal gate adjacent to gate oxide, reject electrons on n-type substrate, and generate electron holes on n-type substrate and electron hole channel under gate structure thereby inducing electron holes of the source/drain region to be transmitted through this channel, NBTI effect is especially influential in CMOS devices containing PMOS structures.

SUMMARY OF THE INVENTION

According to an embodiment of the present invention, a method for fabricating p-type field effect transistor (FET) includes the steps of first providing a substrate, forming a pad layer on the substrate, forming a well in the substrate, performing an ion implantation process to implant germanium ions into the substrate to form a channel region, and then conducting an anneal process to divide the channel region into a top portion and a bottom portion. After removing the pad layer, a gate structure is formed on the substrate and a lightly doped drain (LDD) is formed adjacent to two sides of the gate structure.

According to another aspect of the present invention, a p-type field effect transistor (pFET) includes: a gate structure on a substrate; a channel region in the substrate directly under the gate structure, wherein the channel region comprises a top portion and a bottom portion; and a source/drain region adjacent to two sides of the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
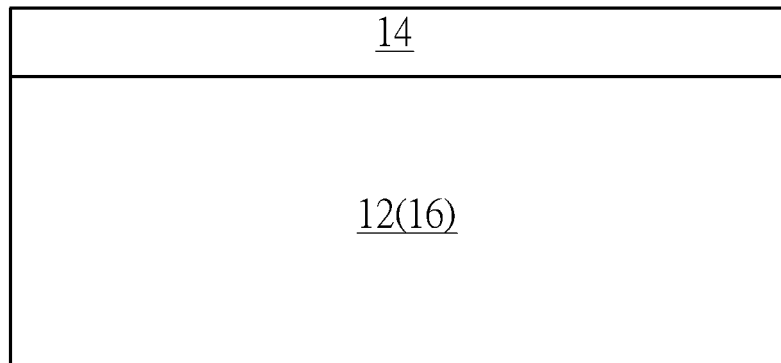
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12, such as a silicon substrate or silicon-on-insulator (SOI) substrate is first provided, at least a transistor region such as a PMOS region used for preparing a p-type field effect transistor (FET) is defined on the substrate 12, and isolation structures such as shallow trench isolation (STI) made of silicon oxide could be formed in the substrate 12 to separate the transistor region.

It should be noted that even though this embodiment pertains to the fabrication of a planar device, it would also be desirable to apply the following process to fabricate a non-planar FET device such as FinFET device. For instance, it would be desirable to form at least a fin-shaped structure on the substrate 12, in which the bottom of the fin-shaped structure is surrounded by a shallow trench isolation (STI), which is also within the scope of the present invention.

According to an embodiment of the present invention, the fin-shaped structure could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, a pad layer 14 is formed on the surface of the substrate 12. In this embodiment, the pad layer 14 is preferably a single-layered structure made of dielectric material including but not limited to for example silicon oxide. It should be noted that even though the pad layer 14 in this embodiment pertains to be a single-layered structure, it would also be desirable to form a pad layer 14 composed of multiple dielectric layers selected from the group consisting of silicon oxide and silicon nitride, which is also within the scope of the present invention.

Next, an ion implantation process is conducted to implant ions through the pad layer 14 and into the substrate 12 to form a well region. Since the present invention pertains to fabricate a p-type FET, the ion implantation is preferably conducted to implant n-type dopants into the substrate 12 to form a n-well 16.

Figure 2:
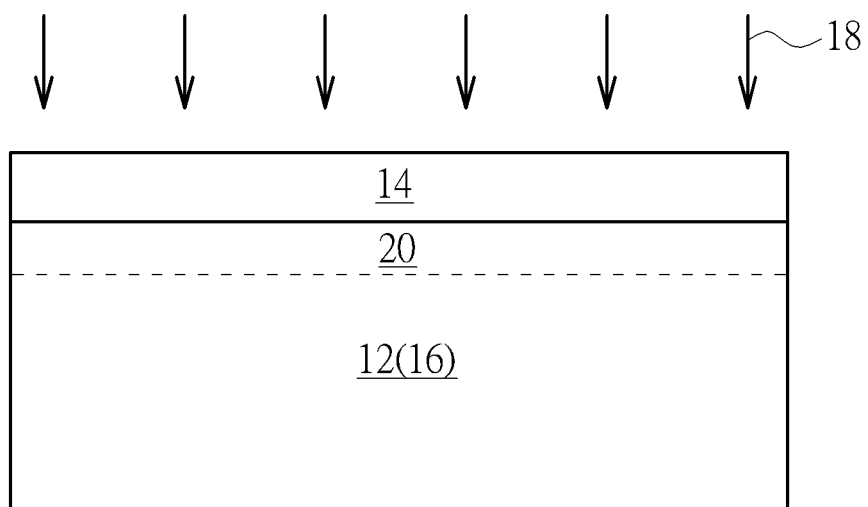

Next, as shown in FIG. 2, another ion implantation process 18 is conducted to implant germanium ions through the pad layer 14 and into the substrate 12 to form a channel region 20 made of silicon germanium (SiGe). It should be noted that as germanium ions are implanted into the substrate 12 to form the channel region 20 the germanium ions within the channel region 20 are arranged according to a gradient distribution. For instance, the concentration of germanium ions closer to the junction or boundary between the pad layer 14 and the channel layer 20 is preferably higher than the concentration of germanium ions closer to the junction or boundary between the channel region 20 and the substrate 12. Nevertheless, there is still no clearly separation between the higher germanium region and the lower germanium region at this stage.

Preferably, the concentration of germanium implanted through the ion implantation process 18 is preferably between $5\times10^{13}$ ions/cm$^2$ to $1\times10^{17}$ ions/cm$^2$ and the energy of the ion implantation process 18 is preferably between 0.5 KeV to 20 KeV. The ion implantation process 18 is preferably a low temperature implantation process, in which the process is preferably conducted at a temperature between 0° C. to 120° C.

Figure 3:
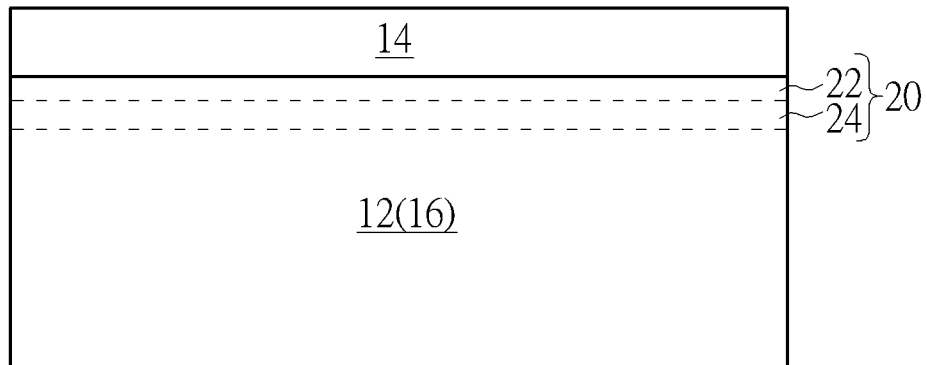

Next, as shown in FIG. 3, an anneal process is conducted to activate the germanium ions within the channel region 20 and at the same time divide the channel region 20 into a top portion 22 and a bottom portion 24. Preferably, the depth of the top portion 22 is equal to the depth of the bottom portion 24, in which the depth of each of the top portion 22 and the bottom portion 24 is preferably between 13 Angstroms to 17 Angstroms or most preferably at around 15 Angstroms.

Moreover, the temperature of the anneal process is preferably greater than 1000° C. or more specifically between 1000° C. to 1200° C. and the germanium concentration of the bottom portion 24 is slightly lower than the germanium concentration of the top portion 22, in which the germanium concentration of the top portion 22 is preferably between $0.9\times10^{22}$ ions/cm$^3$ to $1.1\times10^{22}$ ions/cm$^3$ or most preferably at around $1.0\times10^{22}$ ions/cm$^3$ and the germanium concentration of the bottom portion 24 is preferably between $0.9\times10^{18}$ ions/cm$^3$ to $1.1\times10^{18}$ ions/cm$^3$ or most preferably at around $1.0\times10^{18}$ ions/cm$^3$.

Figure 4:
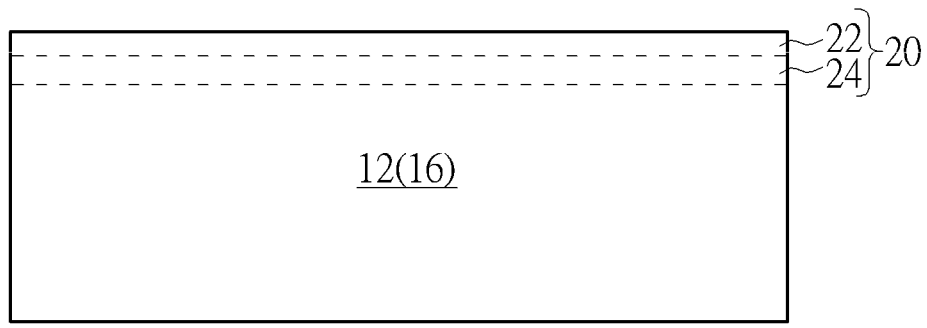

Next, as shown in FIG. 4, an etching process is conducted to remove the pad layer 14 to expose the surface of the substrate 12 or channel region 20. In this embodiment, the removal of the pad layer 14 could be accomplished by using an etchant including but not limited to for example diluted hydrofluoric acid (dHF) to fully remove the pad layer 14 on the surface of the substrate 12 and at the same time remove impurities from the substrate 12 surface.

Figure 5:
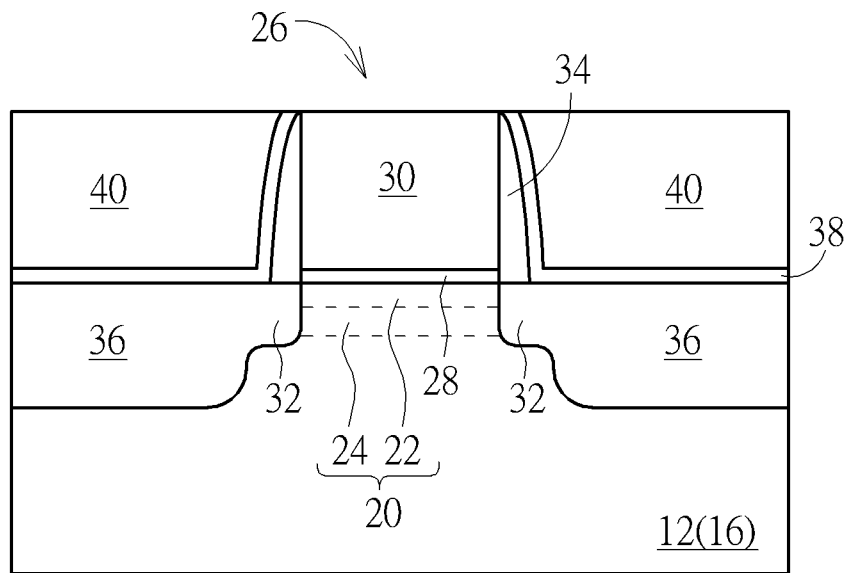

Next, as shown in FIG. 5, a gate structure 26 or dummy gate could be formed on the surface of the substrate 12. In this embodiment, the formation of the gate structure 26 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a photo-etching process is then conducted by using a patterned resist (not shown) as mask to remove part of the gate material layer and part of the gate dielectric layer through single or multiple etching processes. After stripping the patterned resist, a gate structure 26 composed of a patterned gate dielectric layer 28 and a patterned material layer 30 are formed on the substrate 12.

Next, a lightly doped drain 32 is formed in the substrate 12 adjacent to two sides of the gate structure 26, at least a spacer 34 is formed on the sidewalls of the gate structure 26, a source/drain region 36 and/or epitaxial layer is formed in the substrate 12 adjacent to two sides of the spacer 34, and selective silicide layers (not shown) could be formed on the surface of the source/drain region 36. In this embodiment, the spacer 34 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. Each of the lightly doped drain 32 and the source/drain region 36 could include dopants n-type dopants or p-type dopants depending on the type of device being fabricated. Since the present invention pertains to fabricate a p-type FET, both the lightly doped drain 32 and the source/drain region 36 in this embodiment include p-type dopants.

Next, a contact etch stop layer (CESL) 38 is formed on the gate structure 26 and an interlayer dielectric (ILD) layer 40 is formed on the CESL 38. Next, a planarizing process such as CMP is conducted to remove part of the ILD layer 40 and part of the CESL 38 for exposing the gate material layer 30 made of polysilicon, in which the top surface of the gate material layer 30 is even with the top surface of the ILD layer 40.

Figure 6:
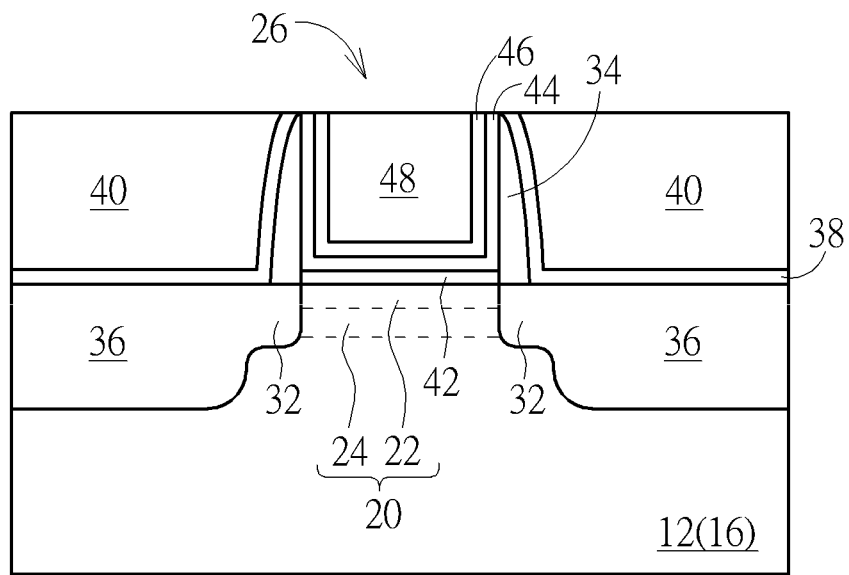

Next, as shown in FIG. 6, a replacement metal gate (RMG) process is conducted to transform the gate structure 26 into metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 30 and even gate dielectric layer 28 from the gate structure 26 for forming a recess (not shown) in the ILD layer 40.

Next, a selective interfacial layer 42 or gate dielectric layer (not shown), a high-k dielectric layer 44, a work function metal layer 46, and a low resistance metal layer 48 are formed in the recesses, and a planarizing process such as CMP is conducted to remove part of low resistance metal layer 48, part of work function metal layer 46, and part of high-k dielectric layer 44 to form gate structure made of metal gate. In this embodiment, the gate structures or metal gate fabricated through high-k last process of a gate last process preferably includes an interfacial layer 42 or gate dielectric layer (not shown), a U-shaped high-k dielectric layer 44, a U-shaped work function metal layer 46, and a low resistance metal layer 48.

In this embodiment, the high-k dielectric layer 44 is preferably selected from dielectric materials having dielectric constant (k value) larger than 4. For instance, the high-k dielectric layer 44 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 46 is formed for tuning the work function of the metal gate in accordance with the conductivity of the device. For an NMOS transistor, the work function metal layer 46 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 46 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 46 and the low resistance metal layer 48, in which the material of the barrier layer may include titanium (Ti), titanium nitride (TiN), tantalum (Ta) or tantalum nitride (TaN). Furthermore, the material of the low-resistance metal layer 48 may include copper (Cu), aluminum (Al), titanium aluminum (TiAl), cobalt tungsten phosphide (CoWP) or any combination thereof.

Referring again to FIG. 6, which further illustrates a structural view of a pFET according to an embodiment of the present invention. As shown in FIG. 6, the pFET includes a gate structure 26 composed of metal gate on the substrate 12, a channel region 20 in the substrate 12 directly under the gate structure 26, a lightly doped drain 32 in the substrate 12 adjacent to two sides of the gate structure 26, and a source/drain region 36 in the substrate 12 adjacent to two sides of the spacer 34.

Viewing from a more detailed perspective, the channel region 20 preferably composed of silicon germanium is divided into a top portion 22 and a bottom portion 24, in which the concentration of germanium in the bottom portion 24 is lower than the concentration of germanium in the top portion 22. In this embodiment, the germanium concentration of the top portion 22 is preferably between 0.9×10$^{22}$ ions/cm$^3$ to 1.1×10$^{22}$ ions/cm$^3$ or most preferably at around 1.0×10$^{22}$ ions/cm$^3$ and the germanium concentration of the bottom portion 24 is preferably between 0.9×10$^{18}$ ions/cm$^3$ to 1.1×10$^{18}$ ions/cm$^3$ or most preferably at around 1.0×10$^{18}$ ions/cm$^3$. Moreover, the depth of the top portion 22 is preferably equal to the depth of the bottom portion 24, in which the depth of each of the top portion 22 and the bottom portion 24 is preferably between 13 Angstroms to 17 Angstroms or most preferably at around 15 Angstroms.

Overall, the present invention discloses an approach to fabricate silicon germanium channel, which preferably forms a pad layer made of silicon oxide on the surface of the substrate, conducts an ion implantation process to implant germanium ions into the substrate to form a channel region, and then performs an anneal process to separate the germanium ions within the channel region into a top portion and a bottom portion, in which the concentration of germanium in the bottom portion is preferably lower than the concentration of germanium in the top portion. By using this approach of segregate germanium concentration in the channel region, it would be desirable to improve the issue of NBTI in pFET devices when negative bias is applied.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A p-type field effect transistor (pFET), comprising:
   a gate structure on a substrate;
   a channel region in the substrate directly under the gate structure, wherein the channel region comprises a top portion and a bottom portion, a depth of the top portion is equal to a depth of the bottom portion, both the top portion and the bottom portion are made of silicon germanium, a concentration of germanium in the bottom portion is lower than a concentration of germanium in the top portion, the concentration of germanium in the top portion is between 0.9×10$^{22}$ ions/cm$^3$ to 1.1×10$^{22}$ ions/cm$^3$, and the concentration of germanium in the bottom portion is between 0.9×10$^{18}$ ions/cm$^3$ to 1.1×10$^{18}$ ions/cm$^3$;
   a lightly doped drain adjacent to two sides of the gate structure; and
   a source/drain region adjacent to two sides of the lightly doped drain, wherein a bottom surface of the bottom portion is higher than bottom surfaces of the lightly doped drain and the source/drain region.

* * * * *